United States Patent
Bayram et al.

(10) Patent No.: US 9,865,769 B2
(45) Date of Patent: *Jan. 9, 2018

(54) BACK CONTACT LED THROUGH SPALLING

(71) Applicant: International Business Machines Corporation, Armonk, NY (US)

(72) Inventors: Can Bayram, Ossining, NY (US); Stephen W. Bedell, Wappingers Falls, NY (US); Ning Li, White Plains, NY (US); Devendra K. Sadana, Pleasantville, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/665,115

(22) Filed: Mar. 23, 2015

(65) Prior Publication Data

US 2016/0284930 A1 Sep. 29, 2016

(51) Int. Cl.

| | |
|---|---|
| *H01L 21/46* | (2006.01) |
| *H01L 21/00* | (2006.01) |
| *H01L 21/469* | (2006.01) |
| *H01L 33/00* | (2010.01) |
| *H01L 33/02* | (2010.01) |
| *H01L 33/60* | (2010.01) |
| *H01L 33/12* | (2010.01) |
| *H01L 33/62* | (2010.01) |
| *H01L 31/18* | (2006.01) |

(52) U.S. Cl.
CPC ........ *H01L 33/025* (2013.01); *H01L 33/0079* (2013.01); *H01L 33/12* (2013.01); *H01L 33/60* (2013.01); *H01L 31/1836* (2013.01); *H01L 31/1852* (2013.01); *H01L 33/62* (2013.01); *H01L 2924/3512* (2013.01)

(58) Field of Classification Search
CPC ............. H01L 31/1836; H01L 31/1852; H01L 33/0079; H01L 33/025; H01L 33/12; H01L 33/60; H01L 33/62; H01L 2924/3512
USPC ....... 438/23, 977, 458, 464, 68, 759; 257/99
See application file for complete search history.

(56) References Cited

U.S. PATENT DOCUMENTS

| | | |
|---|---|---|
| 5,376,580 A | 12/1994 | Kish et al. |
| 5,821,688 A | 10/1998 | Shanks et al. |
| 6,490,402 B1 | 12/2002 | Ota |

(Continued)

FOREIGN PATENT DOCUMENTS

| | | |
|---|---|---|
| CN | 102522479 A | 6/2012 |
| JP | 2001272938 A | 10/2001 |

(Continued)

OTHER PUBLICATIONS

Bedell et al., "Kerf-Less Removal of Si, Ge, and III-V Layers by Controlled Spalling to Enable Low-Cost PV Technologies," IEEE Journal of Photovoltaics, vol. 2, No. 2, Apr. 2012, pp. 141-147.

(Continued)

*Primary Examiner* — Teresa M Arroyo
(74) *Attorney, Agent, or Firm* — Erik K. Johnson (57) ABSTRACT

A method of forming, and corresponding structure, of an LED device where an LED and the contacts for the device are formed on a surface of the substrate, and the substrate is spalled just below the surface of the substrate.

20 Claims, 4 Drawing Sheets

(56) References Cited

U.S. PATENT DOCUMENTS

| | | | |
|---|---|---|---|
| 6,677,918 B2 | 1/2004 | Yuhara et al. | |
| 7,118,930 B1 | 10/2006 | Wuu et al. | |
| 7,341,927 B2 | 3/2008 | Atwater, Jr. et al. | |
| 7,705,826 B2 | 4/2010 | Kalt et al. | |
| 8,063,410 B2 | 11/2011 | Fudeta | |
| 8,269,314 B2 | 9/2012 | Suzuki et al. | |
| 8,278,645 B2 | 10/2012 | Hong et al. | |
| 8,319,243 B2 | 11/2012 | Fudeta | |
| 8,376,581 B2 | 2/2013 | Auld et al. | |
| 8,450,184 B2 | 5/2013 | Bedell et al. | |
| 8,860,005 B1* | 10/2014 | Bedell | H01L 33/10 257/13 |
| 8,969,109 B1* | 3/2015 | Bedell | H01L 33/32 257/13 |
| 9,058,990 B1* | 6/2015 | Bayram | H01L 21/0254 |
| 9,059,339 B1* | 6/2015 | Bayram | H01L 33/0079 |
| 9,079,269 B2* | 7/2015 | Bedell | B23K 26/364 |
| 9,130,105 B2 | 9/2015 | Bedell et al. | |
| 9,263,634 B2 | 2/2016 | Bedell et al. | |
| 9,570,295 B1* | 2/2017 | Bedell | H01L 21/0254 |
| 2002/0013042 A1 | 1/2002 | Morkoc | |
| 2003/0146442 A1 | 8/2003 | Dawson et al. | |
| 2003/0211647 A1 | 11/2003 | Bour et al. | |
| 2008/0048194 A1 | 2/2008 | Kudo et al. | |
| 2009/0219225 A1 | 9/2009 | Cope | |
| 2009/0277314 A1* | 11/2009 | Henley | H01L 31/18 83/15 |
| 2010/0120184 A1 | 5/2010 | Huang et al. | |
| 2010/0264843 A1 | 10/2010 | Herrmann | |
| 2010/0307572 A1 | 12/2010 | Bedell et al. | |
| 2010/0311250 A1* | 12/2010 | Bedell | H01L 31/0725 438/759 |
| 2011/0273410 A1 | 11/2011 | Park et al. | |
| 2011/0291084 A1 | 12/2011 | Burroughes et al. | |
| 2011/0304804 A1 | 12/2011 | Lee et al. | |
| 2012/0019490 A1 | 1/2012 | Huang | |
| 2012/0280263 A1 | 11/2012 | Ibbetson et al. | |
| 2012/0309269 A1 | 12/2012 | Khayyat et al. | |
| 2012/0322244 A1* | 12/2012 | Bedell | H01L 21/187 438/478 |
| 2013/0033488 A1 | 2/2013 | Takahashi et al. | |
| 2013/0126890 A1* | 5/2013 | Bedell | H01L 27/1218 257/76 |
| 2014/0038392 A1 | 2/2014 | Yonehara et al. | |
| 2014/0087504 A1* | 3/2014 | Li | H01L 27/3251 438/34 |
| 2014/0138614 A1 | 5/2014 | Sugiyama et al. | |
| 2014/0242807 A1* | 8/2014 | Bedell | H01L 21/02318 438/759 |
| 2015/0069420 A1* | 3/2015 | Paranjpe | H01L 33/0079 257/79 |
| 2015/0187888 A1* | 7/2015 | Paranjpe | H01L 29/2003 257/76 |
| 2015/0357515 A1 | 12/2015 | Bedell et al. | |
| 2016/0284954 A1* | 9/2016 | Bedell | H01L 33/0079 |

FOREIGN PATENT DOCUMENTS

| | | |
|---|---|---|
| JP | 2012138638 A | 7/2012 |
| JP | 2012138639 A | 7/2012 |
| KR | 1020060039762 A | 5/2006 |

OTHER PUBLICATIONS

Li et al., "High Performance Organic Light-Emitting-Diodes on Graphene Electrode and Thin c-Si TFT for Flexible Display and Lighting," SID Symposium Digest of Technical Papers, vol. 44, No. 1, 2013, pp. 848-851.

Compound Semiconductor. "Reflecting Layer Boosts LED Brightness" www.compoundsemiconductor.net, Apr. 2009, pp. 1-4, Available at http://www.compoundsemiconductor.net/csc/features-details/37883/Reflecting-layer-boosts-LED-brightness.html.

* cited by examiner

BACK CONTACT LED THROUGH
SPALLING

BACKGROUND

The present invention relates to light emitting diode (LED) structures and methods, and more particularly to thin LEDs made by wafer splitting growth substrates employed in growing the LEDs.

GaN-based light-emitting diodes (LEDs) are becoming mainstream as they can provide emitted light wavelengths for general lighting applications, medical applications, etc. However, growth substrates on which LED structures are grown are expensive. In addition to substrate reuse, potentially superior performance of thin LED devices has been a main driving force for selecting thin LED structures over other LED types. For example, more effective heat dissipation strategies can be employed to improve the lifetime of thin LEDs.

BRIEF SUMMARY

An embodiment of the invention may include a method of forming an LED device. The method may form an LED structure and a first contact on a substrate. The method may also form a second contact on the LED structure. A stressor layer may be formed over the LED structure, the first contact, the second contact and the substrate. After forming the stressor layer, spalling of the substrate may occur, whereby spalling propagates a fracture in the substrate.

Another embodiment of the invention may include an LED device. The LED device may contain a spalled substrate, where the spalled substrate has a spalled surface and a top surface located on the opposite side of the spalled surface. The LED device may also contain an LED structure located on the top surface of the spalled substrate. The LED device may also contain a first contact located on the top surface of the spalled substrate. The LED device may also contain a second contact located on the LED structure.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It should also be understood that material compounds will be described in terms of listed elements, e.g., AlGaN, GaN, InGaN, etc. These compounds may include different proportions of the elements within the compound, e.g., InGaN includes $In_xGa_{1-x}N$, where x, is less than or equal to 1, or AlGaN includes $Al_xGa_{1-x}N$ where x is less than or equal to 1, etc. In addition, other elements may be included in the compound, such as, e.g., AlInGaN, and still function in accordance with the present principles. The compounds with additional elements will be referred to herein as alloys.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Spalling is a useful technique in creating thin film devices by fracturing a surface of a crystalline substrate through use of stress created by differences in material properties of the material to be fractured and a stressor material. By forming an LED structure on the surface of a substrate, and then spalling just below the surface, an LED device may be created where all of the apparatuses necessary to emit light are on a non-emitting side of the device, and the spalled side of the device is free of any material or layers that would obscure the light.

Figure 1:
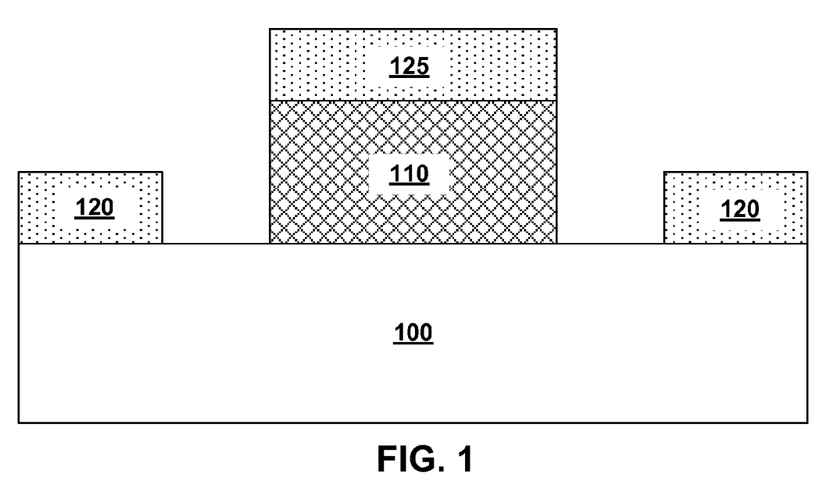
FIG. 1 is a cross-sectional view of an LED structure and contacts, according to an example embodiment.

Referring first to FIG. 1, there is illustrated a crystalline semiconductor substrate 100 which includes at least LED structure 110 and first contact 120 fabricated thereon in accordance with a first process embodiment of the present disclosure.

The semiconductor material of the crystalline semiconductor substrate 100 may include, but is not limited to, Si, Ge, SiGe, SiGeC, SiC, Ge alloys, GaSb, GaP, GaN, GaAs, InAs, InP, and all other III-V or II-VI compound semiconductors. Typically, the crystalline semiconductor substrate 100 may be silicon. In some embodiments, the crystalline semiconductor substrate 100 is a bulk semiconductor material. In other embodiments, the crystalline semiconductor substrate 100 may comprise a layered semiconductor material such as, for example, a semiconductor-on-insulator or a semiconductor on a polymeric substrate. Illustrated examples of semiconductor-on-insulator substrates that can be employed as crystalline semiconductor substrate 100 include silicon-on-insulators and silicon-germanium-on-insulators. The crystalline semiconductor substrate 100 can be doped, undoped or contain doped regions and undoped regions.

The term "crystalline" as used in connection with the term crystalline semiconductor substrate 100 denotes a semiconductor material in which a single crystal lattice of the entire sample is continuous and unbroken to the edges of the sample, with no grain boundaries, or in which a polycrystalline lattice of the entire sample contains multiple crystal types. In a preferred embodiment, the crystalline semiconductor substrate 100 is a single crystal lattice structure. The crystalline semiconductor substrate 100 that may be employed in the present disclosure comprise a semiconductor material whose fracture toughness is less than that of the stressor material to be subsequently described. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

The LED structure 110, first contact 120, and second contact 125 can be formed utilizing techniques well known to those skilled in the art. The upper portion of the substrate 100 that includes the LED structure 110, first contact 120, and second contact 125 can be removed from a remaining portion of the crystalline semiconductor substrate 100 utilizing the method of the present disclosure.

The first contact 120 and the second contact 125 may be p-type or n-type contacts. However, if the first contact 120 is a p-type contact, the second contact 125 is an n-type, and vice-versa. The second contact 125 may be a reflective contact, or contain a reflective layer, capable of reflecting the wavelength of light emitted by the LED structure 110. A first contact 120 includes a doped crystalline material that may be epitaxially grown on the substrate 100. In one embodiment, the first contact 120 includes GaN. A second contact 125 includes a doped crystalline epitaxially grown material having an opposite dopant conductivity than the first contact 120. The first contact 120 and second contact 125 may respectively include n-doped GaN and p-doped GaN. The first contact 120 and second contact 125 may be about 500 nm thick but can be made any thickness, e.g., if thinner, the first contact 120 and second contact 125 need to have a higher doping concentration.

Figure 2:
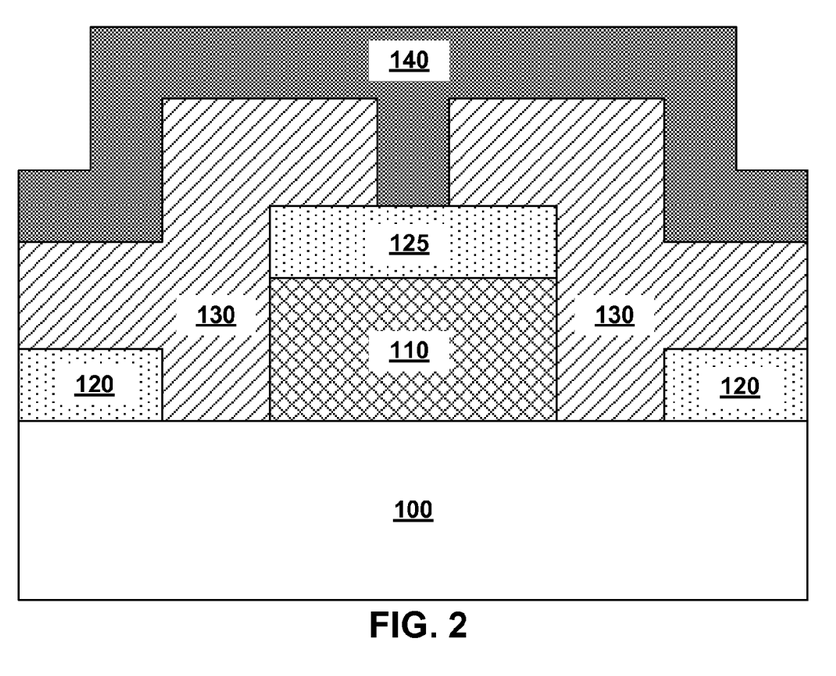
FIG. 2 is a cross-sectional view of an LED structure and contacts following deposition of an oxide and stressor layer, according to an example embodiment.

Referring to FIG. 2, there is illustrated the structure of FIG. 1 after forming a protective oxide 130 on an exposed surface of the crystalline semiconductor substrate 100 and after forming a stressor layer 140 above the protective oxide 130. The protective oxide 130 that is employed in the present disclosure includes any material which can serve as an etch stop for the subsequently formed stressor layer 140. The protective oxide 130 may be selected in order to transfer a stress from the stressor layer 140 to the crystalline semiconductor substrate 100. In such embodiments, the protective oxide 130 may be any suitable insulator, oxide, nitride or oxynitride, such as, for example, silicon oxide, silicon nitride or silicon oxynitride. Deposition of the protective oxide 130 may be performed by any suitable method known in the art such as, for example, CVD, or spin-on deposition. In some embodiments, the second contact 125 may be exposed, using CMP to remove the entirety of the material above the second contact 125, or through lithographic patterning and etching of away an unpatterned region of the protective oxide.

In one embodiment, the protective oxide 130 typically has a thickness from 5 nm to 300 nm, with a thickness from 100 nm to 150 nm being more typical. Other thicknesses for the protective oxide 130 that are below and/or above the aforementioned thickness ranges can also be employed in the present disclosure.

Figure 6:
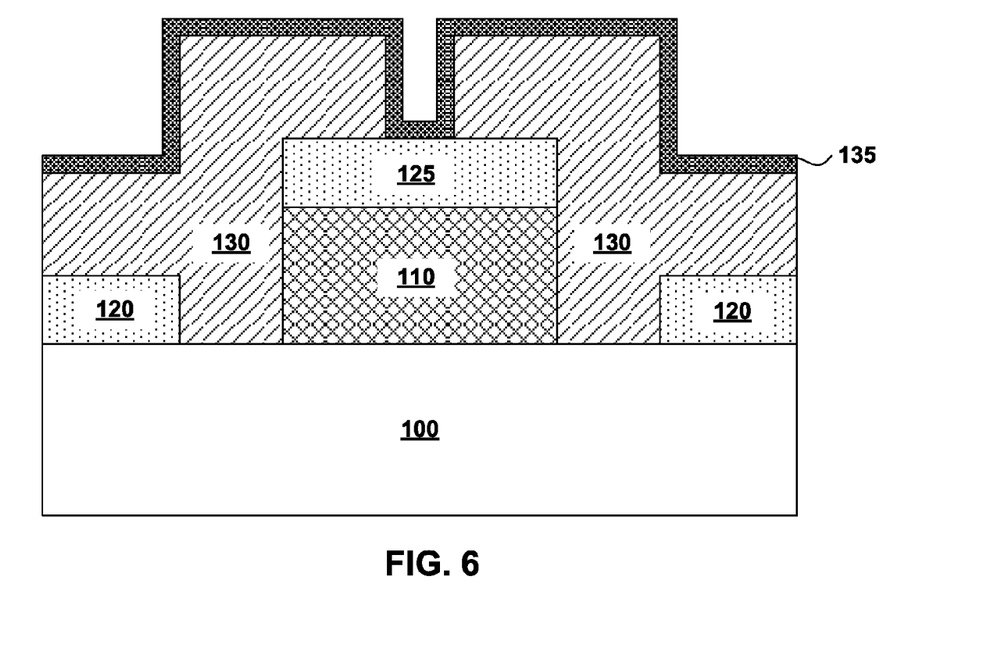
FIG. 6 is a cross-sectional view of an LED structure and contacts following deposition of a seed layer on an oxide layer, according to an example embodiment.

In some embodiments (as depicted in FIG. 6), prior to forming the stressor layer 140, an optional plating seed layer 135 can be formed on the protective oxide 130. The optional plating seed layer 135 is typically employed in embodiments in which the stressor material to be subsequently formed is a metal and plating is used to form the metal-containing stressor material. The optional plating seed layer 135 is employed to selectively promote subsequent plating of a pre-selected metal-containing stressor material. The optional plating seed layer may comprise, for example, a single layer of Ni or a layered structure of two or more metals such as Al(bottom)/Ti/Ni(top).

The thickness of the optional plating seed layer 135 may vary depending on the material or materials of the optional plating seed layer as well as the technique used in forming the same. Typically, the optional plating seed layer 135 has a thickness from 2 nm to 400 nm. The optional plating seed layer 135 can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present disclosure, the protective oxide 130 and, if employed, the optional plating seed layer 135, is (are) formed at a temperature which does not effectuate spontaneous spalling to occur within the crystalline semiconductor substrate 100. By "spontaneous" it is meant that the removal of a thin material layer from the crystalline semiconductor substrate 100 occurs without the need to employ any manual means to initiate crack formation and propagation for breaking apart the thin material layer from the crystalline semiconductor substrate 100. By "manual" it is meant that crack formation and propagation are explicit for breaking apart the thin material layer from the crystalline semiconductor substrate 100.

The stressor layer 140 that is employed in the present disclosure includes any material that is under tensile stress when located atop the crystalline semiconductor substrate 100 at the spalling temperature. As such, the stressor material can also be referred to herein as a stress-inducing material. In accordance with the present disclosure, the stressor layer 140 has a critical thickness and stress value that cause spalling mode fracture to occur within the crystalline semiconductor substrate 100. By "spalling mode fracture" it is meant that a crack is formed within the crystalline semiconductor substrate 100 and the combination of loading forces maintain a crack trajectory at a depth below the stressor/substrate interface. By "critical condition", it is meant that for a given stressor material and crystalline semiconductor substrate material combination, a thickness value and a stressor value for the stressor layer 140 is chosen that render spalling mode fracture possible (can produce a $K_I$ value greater than the $K_{IC}$ of the substrate).

The thickness of the stressor layer 140 is chosen to provide a desired fracture depth(s) within the crystalline semiconductor substrate 100. For example, if the stressor layer 140 is chosen to be Ni, then fracture will occur at a depth below the stressor layer 140 roughly 2 to 3 times the Ni thickness. The stress value for the stressor layer 140 is chosen to satisfy the critical condition for spalling mode fracture. This can be estimated by inverting the empirical equation given by $t^* = [(2.5 \times 10^6)(K_{Ic}^{3/2})]\sigma^2$, where $t^*$ is the critical stressor layer thickness (in microns), KIC is the fracture toughness (in units of $MPa \cdot m^{1/2}$) of the crystalline semiconductor substrate 100 and $\sigma$ is the stress value of the stressor layer 140 (in MPa or megapascals). The above expression is a guide, in practice, spalling can occur at stress or thickness values up to 20% less than that predicted by the above expression.

Illustrative examples of materials that are under tensile stress when applied above the crystalline semiconductor substrate 100 and thus can be used as the stressor layer 140 include, but are not limited to, a metal, a polymer, such as a spall inducing tape layer, or any combination thereof. The stressor layer 140 may comprise a single stressor material, or a multilayered stressor structure including at least two layers of different stressor material can be employed.

In one embodiment, the stressor layer 140 is a metal. In another embodiment, the stressor layer 140 is a spall inducing tape. In yet another embodiment, the stressor layer 140 may comprise a two-part stressor layer including a lower part and an upper part. The upper part of the two-part stressor layer can be comprised of a spall inducing tape layer.

When a metal is employed as stressor layer 140, the metal can include, for example, Ni, Cr, Fe, or W. Alloys of these metals can also be employed. In one embodiment, the stressor layer 140 includes at least one layer consisting of Ni.

When a polymer is employed as stressor layer 140, the polymer is a large macromolecule composed of repeating structural units. These subunits are typically connected by covalent chemical bonds. Illustrative examples of polymers that can be employed as the stressor layer include, but are not limited to, polyimides, polyesters, polyolefins, polyacrylates, polyurethane, polyvinyl acetate, and polyvinyl chloride.

When a spall inducing tape layer is employed as stressor layer 140, the spall inducing tape layer includes any pressure sensitive tape that is flexible, soft, and stress free at a first temperature used to form the tape, yet strong, ductile and tensile at a second temperature used during spalling. By "pressure sensitive tape," it is meant an adhesive tape that will stick with application of pressure, without the need for solvent, heat, or water for activation. Tensile stress in the tape at the second temperature is primarily due to thermal expansion mismatch between the crystalline semiconductor substrate 100 (with a lower thermal coefficient of expansion) and the tape (with a higher thermal expansion coefficient).

Typically, the pressure sensitive tape that is employed in the present disclosure as stressor layer 140 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

The stressor layer 140 can be formed utilizing any well known deposition process. Generally, deposition may be accomplished by any of dip coating, spin-coating, brush coating, sputtering, chemical vapor deposition, plasma enhanced chemical vapor deposition, chemical solution deposition, physical vapor deposition, and plating to form the stressor layer 140 that includes a metal or polymer as the stressor material. In some embodiments, and when the stressor layer 140 is a tape, the stressor layer 140 can be applied by hand or by mechanical means.

The stressor layer 140 can be formed at a first temperature which is at room temperature (15° C. to 40° C.). In another embodiment, when a tape layer is employed, the tape layer can be formed at a first temperature which is from 15° C. to 60° C.

If the stressor layer 140 is of a metallic nature, it typically has a thickness within a range from 3 μm to 50 μm, with a thickness within a range from 4 μm to 7 μm being more typical. Other thicknesses for the stressor layer 140 that are below and/or above the aforementioned thickness ranges can also be employed in the present disclosure.

If the stressor layer 140 is of a polymeric nature, it typically has a thickness in a range from 10 μm to 200 μm, with a thickness within a range from 50 μm to 100 μm being more typical. Other thicknesses for the stressor layer 140 that are below and/or above the aforementioned thickness ranges can also be employed in the present disclosure.

Figure 3:
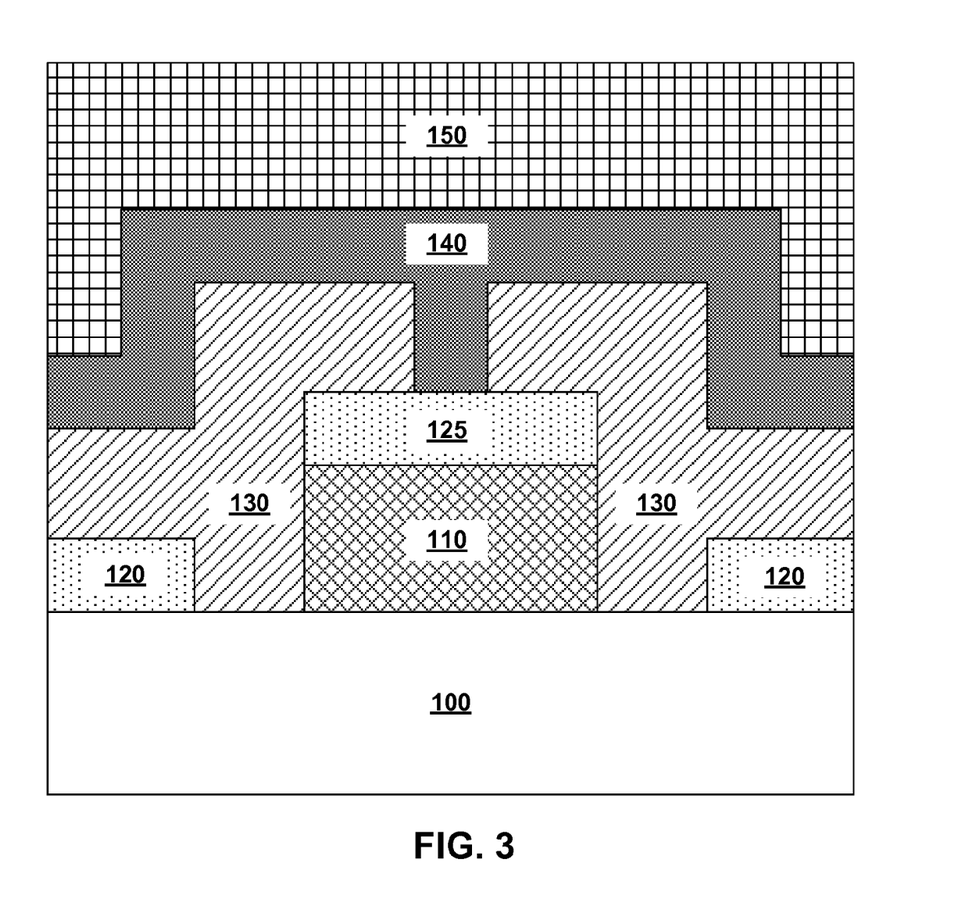
FIG. 3 is a cross-sectional view of an LED structure and contacts following forming a handle substrate above an oxide and stressor layer, according to an example embodiment.

Referring to FIG. 3, a handle substrate 150 may be formed above the stressor layer 140 and prior to spalling. In some embodiments of the present disclosure, the handle substrate 150 can be omitted. Thus, handle substrate 150 is an optional component of the present disclosure. The handle substrate 150 employed in the present disclosure comprises any flexible material which has a minimum radius of curvature that is typically less than 30 cm. Illustrative examples of flexible materials that can be employed as the handle substrate 150 include a metal foil or a polyimide foil.

The handle substrate 150 can be used to provide better fracture control and more versatility in handling the spalled portion, i.e., the portion of the crystalline semiconductor substrate 100 below the stressor layer 140 and above the fracture surfaces of the crystalline semiconductor substrate 100. Moreover, the handle substrate 150 can be used to guide the crack propagation during spalling. The handle substrate 150 of the present disclosure is typically, but not necessarily, formed at a first temperature which is at room temperature (15° C.-40° C.).

The handle substrate 150 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. In some embodiments, the handle substrate 150 can be applied atop the stressor layer 140 by hand or by mechanical means.

The handle substrate 150 typical has a thickness of from 1 μm to few mm, with a thickness of from 70 μm to 120 μm being more typical. Other thicknesses for the handle substrate 150 that are below and/or above the aforementioned thickness ranges can also be employed in the present disclosure.

Figure 4:
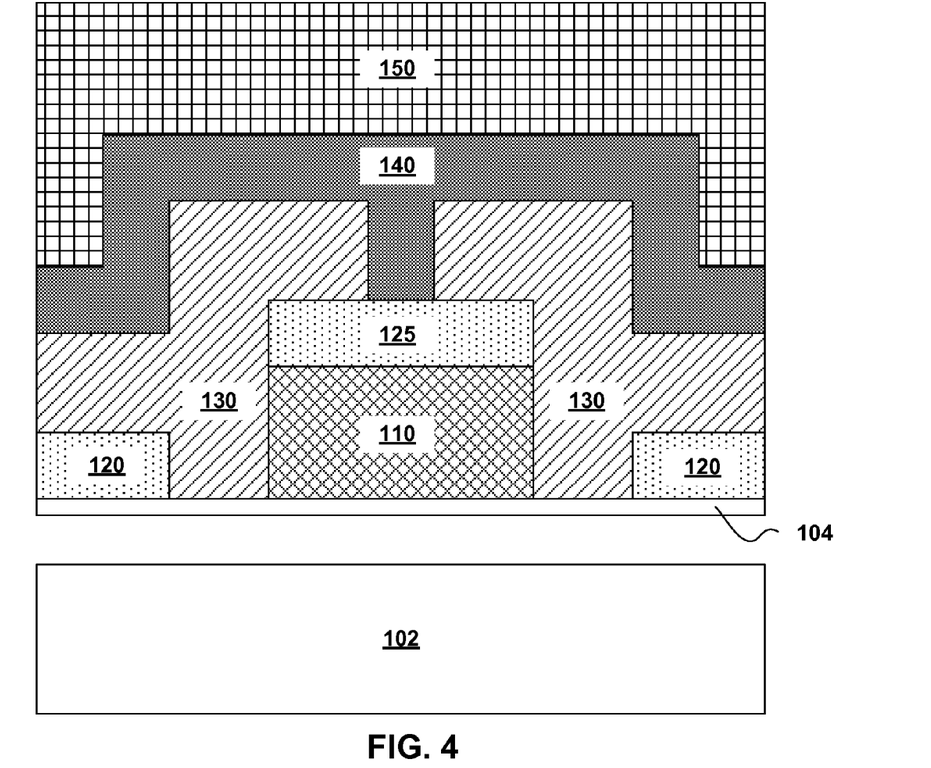
FIG. 4 is a cross-sectional view of an LED structure and contacts during spalling of the substrate, according to an example embodiment.

As shown in FIG. 4, spalling removes a portion of the crystalline semiconductor substrate 100 just the LED structure 110, first contact 120, and second contact 125 from the bulk of the crystalline semiconductor substrate 100. In the drawing, element 102 refers to the portion of the crystalline semiconductor substrate 100, while element 104 refers to the portion of the crystalline semiconductor substrate just below LED structure 110, first contact 120, and second contact 125.

Element 104 can also be referred to herein as a spalled crystalline semiconductor layer (or spalled layer for short), while element 102 can be referred to herein as a non-spalled layer. As shown, the spalled layer 104 contains a portion of the crystalline semiconductor substrate 100 as well as the LED structure 110, first contact 120, and second contact 125 all located on the same surface of the spalled layer 104.

In one embodiment of the present disclosure, the spalled layer 104 has a thickness of less than 100 microns. In another embodiment of the present disclosure, the spalled layer 104 has a thickness of less than 50 microns. In yet another embodiment of the present disclosure, spalled layer 104 has a thickness of less than 20 microns.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

Figure 5:
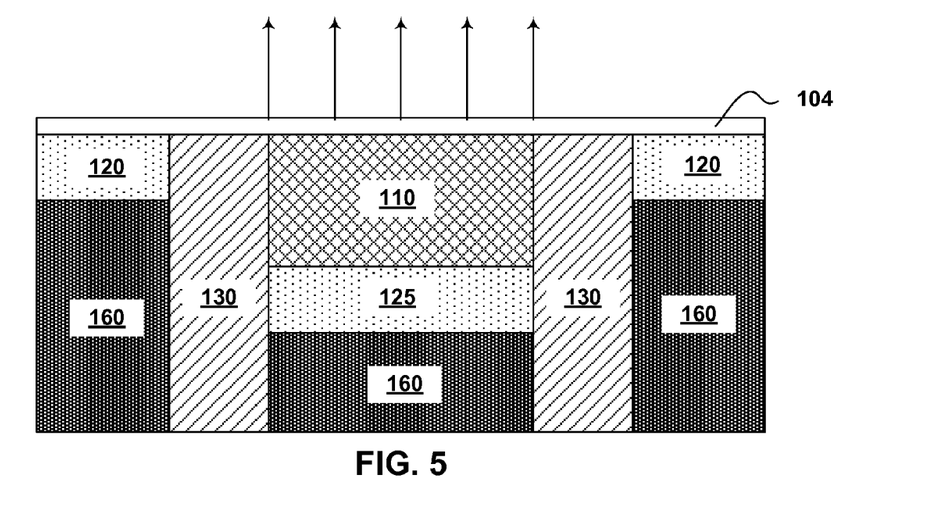
FIG. 5 is a cross-sectional view of an LED structure and contacts following spalling of the substrate, according to an example embodiment.

Referring to FIG. 5, the handle substrate 150 and stressor layer 140 may be removed, and electrical connections 160 may be formed on the first contact 120 and the second contact 125. Any combination of conventional removal techniques such as, for example, CMP, etching or heat treatment may be used to remove the handle substrate 150 and stressor layer 140.

Following the removal of the handle layer 150 and stressor layer 140, electrical connections 160 may be formed on the first contact 120 and the second contact 125, using methods generally known in the art. For example, a lithographic pattern may be deposited on the protective oxide 130, and an etch, e.g. RIE, may be performed to remove the protective oxide 130 above the first contact 120 and the second contact 125. An electrical connection 160 may contain any material capable of allowing current to flow to or from the first contact 120 and the second contact 125. For example, the electrical connection 160 may contain a liner and a metal fill may be deposited. The liner may be made of, for example, tantalum or tantalum nitride, or titanium and titanium nitride, as adhesion layer for subsequent tungsten deposition, and may include one or more layers of liner material. The metal fill may include, for example, copper, aluminum, or tungsten. The liner and metal fill may be formed using a filing technique such as electroplating, electroless plating, chemical vapor deposition, physical vapor deposition or a combination of methods.

Following forming the electrical connections 160, a spalled LED structure exists where light may be emitted through the spalled layer 104. The light may be emitted when a current is applied to induce current from the first contact 120, through the LED structure 110, to the second contact 120, or vice-versa. The first contact 120, second contact 125 and LED structure 110 are all located on the back side (or non-emitting side) of the spalled layer 104. This allows for a device that does not obscure any of the light generated by the LED with either electrical contacts, or connections, and may create a more efficient LED device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming an LED device, the method comprising:
    forming an LED structure on a substrate; forming a first contact on the substrate;
    forming a second contact on the LED structure; forming a stressor layer over the LED structure, the first contact, the second contact and the substrate;
    spalling the substrate, wherein spalling propagates a fracture in the substrate.

2. The method of claim 1, wherein the first contact is a p-type contact, and the second contact is an n-type contact.

3. The method of claim 1, wherein the first contact is a n-type contact, and the second contact is an p-type contact.

4. The method of claim 1, wherein spalling propagates a fracture less than 100 microns from the surface of the substrate.

5. The method of claim 1, the second contact comprises a reflective contact.

6. The method of claim 1, wherein prior to forming the stressor layer a plating seed layer is formed.

7. The method of claim 1, wherein an oxide is formed over the LED structure, the first contact, the second contact and the substrate prior to forming the stressor layer.

8. The method of claim 1, wherein the stressor layer comprises a metal.

9. The method of claim 5, wherein the metal of the stressor layer comprises nickel, chromium, iron or tungsten.

10. The method of claim 1, wherein the stressor layer comprises a polymer.

11. The method of claim 1, wherein the stressor layer comprises a stress inducing tape.

12. The method of claim 1, wherein a handle layer is formed above the stressor layer prior to spalling.

13. The method of claim 1, wherein the substrate comprises silicon.

14. An LED device, the LED device comprising:
 a spalled substrate, wherein the spalled substrate has a spalled surface and a top surface located on the opposite side of the spalled surface;
 an LED structure located on the top surface of the spalled substrate;
 a first contact located on the top surface of the spalled substrate; and
 a second contact located on the LED structure.

15. The device of claim 14, wherein the first contact is a p-type contact, and the second contact is an n-type contact.

16. The device of claim 14, wherein the first contact is a n-type contact, and the second contact is an p-type contact.

17. The device of claim 14, wherein the second contact comprises a reflective contact.

18. The device of claim 14, wherein the spalled substrate is less than 100 microns thick.

19. The device of claim 14, wherein an oxide is located above top surface of the spalled substrate.

20. The device of claim 14, wherein the spalled substrate comprises silicon.

* * * * *